(12) United States Patent
Ebli

(10) Patent No.: US 12,713,991 B2
(45) Date of Patent: Aug. 18, 2026

(54) POWER SEMICONDUCTOR MODULE

(71) Applicant: Infineon Technologies AG, Neubiberg (DE)

(72) Inventor: Michael Ebli, Bad Sassendorf (DE)

(73) Assignee: Infineon Technologies AG, Neubiberg (DE)

( * ) Notice: Subject to any disclaimer, the term of this patent is extended or adjusted under 35 U.S.C. 154(b) by 953 days.

(21) Appl. No.: 17/829,610

(22) Filed: Jun. 1, 2022

(65) Prior Publication Data

US 2022/0399259 A1 Dec. 15, 2022

(30) Foreign Application Priority Data

Jun. 10, 2021 (EP) .................................... 21178669

(51) Int. Cl.

| | |
|---|---|
| ***H10W 90/00*** | (2026.01) |
| ***H10W 70/65*** | (2026.01) |
| *H10W 40/25* | (2026.01) |
| *H10W 42/80* | (2026.01) |

(52) U.S. Cl.

CPC ....... *H10W 90/701* (2026.01); *H10W 70/658* (2026.01); *H10W 40/255* (2026.01); *H10W 42/80* (2026.01); *H10W 90/737* (2026.01)

(58) Field of Classification Search

CPC ..... H01L 23/49811; H01L 23/62; H01L 23/49
See application file for complete search history.

(56) References Cited

U.S. PATENT DOCUMENTS 6,667,545 B1 12/2003 Spitz
2004/0046246 A1 3/2004 Cheng et al.
2013/0082373 A1* 4/2013 Duetemeyer ....... H01L 23/3735 257/690
2016/0014916 A1* 1/2016 Ausserlechner ....... H05K 1/053 361/699
2020/0203881 A1* 6/2020 Marzano .............. H01R 13/719
2022/0145189 A1 5/2022 Xu et al.
2022/0285253 A1* 9/2022 Olleres ............. H01L 23/49805

FOREIGN PATENT DOCUMENTS

| | | | |
|---|---|---|---|
| CH | 422096 | A | 10/1966 |
| DE | 102007052630 | A1 | 5/2009 |
| DE | 102012213573 | B3 | 9/2013 |
| DE | 102014109816 | A1 | 1/2016 |
| EP | 1043591 | A2 | 10/2000 |
| EP | 1043591 | A3 | 5/2004 |
| EP | 3633722 | A1 | 4/2020 |
| JP | 2016086494 | A | 5/2016 |

* cited by examiner

*Primary Examiner* — Norman D Richards
(74) *Attorney, Agent, or Firm* — Murphy, Bilak & Homiller, PLLC

(57) ABSTRACT

A power semiconductor module includes an electrically insulating carrier plate with a structured, electrically conducting metallization layer disposed on a surface thereof, and a connection pin having two ends and being adhered to the carrier plate, one end of the connection pin being electrically connected to the metallization layer. The module further includes a semiconductor device adhered to the carrier plate and electrically connected to the metallization layer, and a discrete circuit including a voltage-or-current-or-both controlling device, the voltage-or-current-or-both controlling device being operatively coupled with the semiconductor device and being integrated in the connection pin at one of or between the two ends of the connection pin.

14 Claims, 3 Drawing Sheets

114
115
110
112
108
113
109
111
104
105

106
107
Solder
Solder
Copper layer on DCB
Creamic DCB
Copper layer on DCB
102
101
103

114
115
110
201
108
104
202
203
106
204
Solder
Solder

Copper layer on DBC
Creamic DBC
Copper layer on DBC
102
101
103

POWER SEMICONDUCTOR MODULE

TECHNICAL FIELD

The instant disclosure relates to a power semiconductor module having a power semiconductor device, a carrier plate and at least one connection pin.

BACKGROUND

A common power semiconductor module includes a short circuit detection mechanism that monitors the behavior of a semiconductor power device, for example, a metal-oxide semiconductor (MOS) field-effect transistor (FET) operated as a switch and contained in the module. The short circuit detection mechanism may be implemented by way of a gate driver that evaluates the saturation voltage along the load path of the field-effect transistor involving a high voltage diode. Commonly this diode is disposed at the carrier plate (e.g., a printed circuit board or a ceramics substrate), and a lot of space is required around the diode on the substrate to ensure necessary creepage and clearance distances. In other applications, high voltages, such as the direct current link voltage, need to be measured in power semiconductor modules, for example, by way of a voltage divider. The voltage divider is commonly placed on the substrate and dissipates a significant amount of heat, which requires space around the voltage divider in order to provide sufficient cooling and to ensure clearance and creepage distances. In still other applications, a negative temperature coefficient (Nit) resistor is used to measure the temperature of the module, which is commonly disposed on the carrier plate. Again some space around the NTC resistor on the carrier plate is required to dissipate heat from the NTC resistor to the carrier plate. Typically, there is not much space available on or close to the substrate so that it is desirable to provide an arrangement of a voltage controlling element that requires less space on or close to the substrate.

There is a need for a power semiconductor module that provides more space around specific devices in the module.

SUMMARY

A power semiconductor module includes an electrically insulating carrier plate with a structured, electrically conducting metallization layer disposed on a surface thereof, and at least one connection pin having two ends and being adhered to the carrier plate, one end of the connection pin being electrically connected to the metallization layer. The module further includes a semiconductor device adhered to the carrier plate and electrically connected to the metallization layer, and a discrete circuit that includes a voltage-or-current-or-both controlling device, wherein the voltage-or-current-or-both controlling device is operatively coupled with the semiconductor device and integrated in the connection pin at one of or between the two ends of the connection pin.

BRIEF DESCRIPTION OF THE DRAWINGS

The invention may be better understood with reference to the following drawings and description. The devices in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples of how the invention may be practiced. It is to be understood that the features and principles described with respect to the various examples may be combined with each other, unless specifically noted otherwise. In the description as well as in the claims, designations of certain elements as “first element”, “second element”, “third element” etc. are not to be understood as enumerative. Instead, such designations serve solely to designate different “elements”. That is, e.g., the existence of a “third element” does not require the existence of a “first element” and a “second element”. A semiconductor body as described herein may be made from (doped) semiconductor material and may be a semiconductor chip or may be included in a semiconductor chip. A semiconductor body has electrically connecting pads and includes at least one semiconductor element with electrodes.

A power semiconductor module provides the physical containment for one or more power semiconductor devices. These power semiconductor devices (also referred to as dies) are typically soldered or sintered on an electrically insulating carrier plate with at least one structured metal layer such as, for example, a power electronic substrate which provides support for the power semiconductor devices, and which provides electrical and thermal contact and electrical insulation where needed. Compared to discrete power semiconductors in plastic housings, power semiconductor modules are packages that provide a higher power density and are in many cases more reliable. Besides modules that contain a single power electronic semiconductor device (such as MOSFET, IGBT, BJT, Thyristor, GTO or JFET or diode), classical power semiconductor modules contain multiple semiconductor dies that are connected to form an electrical circuit of a certain structure, called topology. Power semiconductor modules may also contain other devices such as, for example, resistors or capacitors to minimize switching voltage overshoots or NTC resistors to monitor the module's substrate temperature. Traditionally, screw contacts provide the electrical connection between the module and external parts of a power electronic system. Additionally or alternatively, pin contacts (soldered on the substrate) or press-fit contacts pressed in the substrate, may be used. Press-fit pins achieve a very high reliability and ease the mounting process by eliminating the need for soldering. Power modules are used in power conversion equipment such as, for example, industrial motor drives, embedded motor drives, uninterruptible power supplies, AC-DC power supplies and welder power supplies. Power modules are also widely found in inverters for renewable energies such as wind turbines, solar power panels, tidal power plants and electric vehicles.

Figure 1:
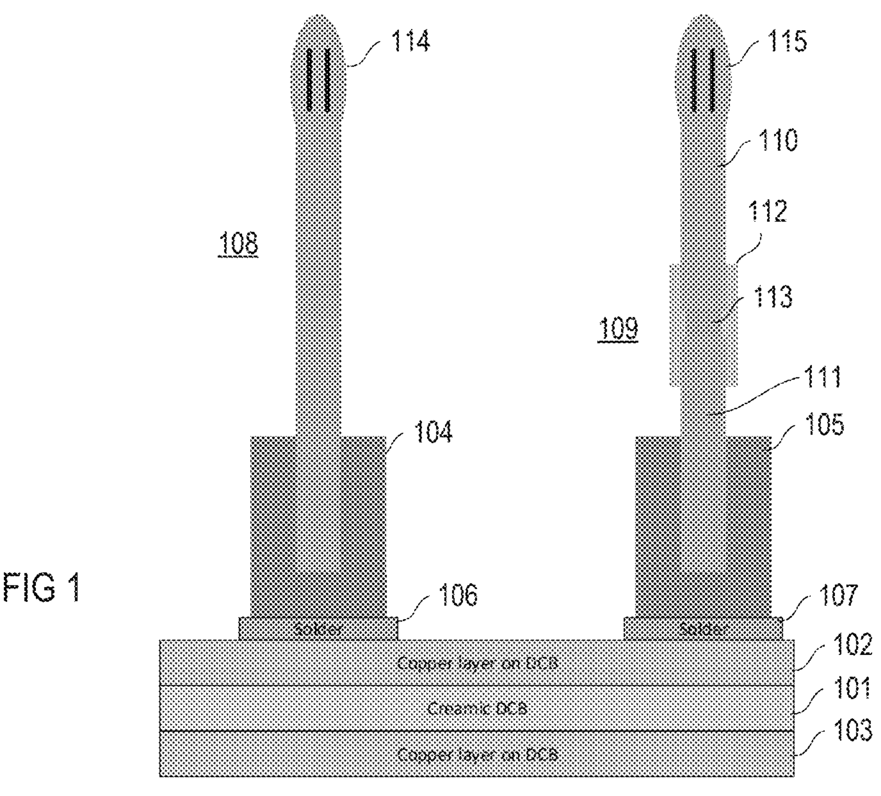
FIG. 1 is a cross-sectional view illustrating an exemplary embodiment of a power semiconductor module having a two-piece connection pin, into which a voltage-or-current-or-both controlling device is integrated by embedding the voltage-or-current-or-both controlling device in a compound mold, which adheres the two pieces of the connection pin to each other.

FIG. 1 illustrates a first exemplary embodiment of a power semiconductor module which includes a carrier plate, such as, for example, a direct bonded copper (DCB) ceramic substrate (shown in the figures), a printed circuit board (PCB), or any other type of suited electrically insulating plate with a conductor pattern on it, herein referred to as substrate 101. The power semiconductor module further includes at least one electrically conducting, structured layer. In the exemplary module shown in FIG. 1, the substrate 101 includes two layers 102 and 103 such as, for example, copper layers (shown in the figures), aluminum layers or any other suited metal or metal composite layers, each adhered to one of two opposing sides of the substrate 101. Two electrically conducting (e.g., metal) hulls 104 and 105 are adhered to one (102) of the structured layers 102 and 103 by way of solder layers 106 and 107. The hulls 104 and 105 have a cup-like shape with a bottom wall and a side wall. The bottom wall of each hull 104, 105 is adhered to the structured layer 102 and the bottom wall and the side wall encompass a cavity. Electrically conducting (metal) pins 108 and 109 having two ends and a shaft between these ends are pressed at one of their ends into the cavities of the hulls 104, 105 to provide electrical contact as well as mechanical clamp, and to form electrical/mechanical sockets for the pins 108 and 109.

One (108) of the pins 108 and 109 is a conventional solid one-piece pin with a press fit contact area 114 at least at its end opposite to the shaft. The other pin (109) has a similar or identical shape but is embodied in two pieces 110 and 111, of which piece 110 includes the end of the pin intended for external connection and a press-fit area 115, and piece 111 includes the end pressed into the cavity of the hull 105. The two pieces 110 and 111 are mechanically connected to each other by an electrically insulating jacket formed from, e.g., a mold compound 112. The mold compound 112 may include epoxy resin or any other suitable organic or non-organic plastics. The electrical connection between the two pieces 110 and 111 is provided by a voltage-or-current-or-both controlling device 113 (voltage and/or current controlling device) that may be soldered, pressed or bonded onto the two pieces 110 and 111. The voltage-or-current-or-both controlling device 113 may be an ohmic resistor, thermistor, diode, capacitor or any other two pole electrical element that controls the voltage over the device or the current through the device or both dependent on at least one of the temperature of the device, the voltage over the device and/or the current through the device.

Alternatively, the pins may be solder pins, i.e., the pins have solder areas in place of the press-fit areas 114 and 115. The solder areas as well as the press-fit areas 114 and 115 provide electrical contact to external circuitry such as, for example, another substrate, a solderable wire connection or a plug-in connection. Therefore, the two ends of the hulls 104 and 105 may have a sinterable and/or solderable surface in order to allow for a specific electrical (and mechanical) connection.

As can be seen from FIG. 1, the electrical device 113 is inserted between the two pieces 110 and 111 of the pin 109. The two pieces 110 and 111 of the pin 109 are mechanically connected by the adhesion produced in the molding process. Mechanical stability of the physical connection is provided by the mold compound 112 around the two pieces 110 and 111 of the pin 109. As the voltage-or-current-or-both controlling device 113 is embedded in the mold compound 112, it is protected against all external contaminants like dust or moisture. The voltage-or-current-or-both controlling device 113 may be sintered or soldered to the two pieces 110 or 111 of the pin 109. This exemplary interface enables the electrical connection between the two pieces 110 and 111 of the pin 109.

Figure 2:
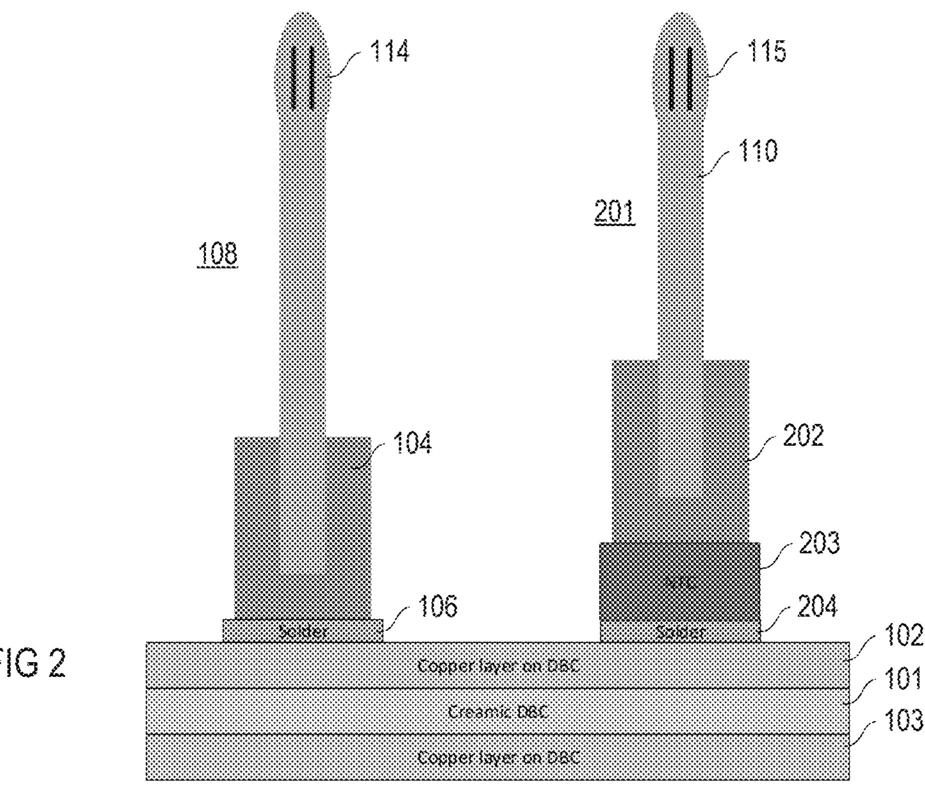
FIG. 2 is a cross-sectional view illustrating an exemplary embodiment of a power semiconductor module having a one-piece connection into which a voltage-or-current-or-both controlling device is integrated by way of a hull at one end of the pin.

In the embodiment shown in FIG. 2, which illustrates a modification of the embodiment shown in and described above in connection with FIG. 1, the two-piece pin 109 and the hull 107 shown in FIG. 1 are replaced by a one-piece pin 201 and a hull 202. A voltage-or-current-or-both controlling device 203, which in this example may be a thermistor, for example, an NTC resistor (or diode or any other device), is soldered at one end to the structured metal layer 102 and at its other end forms or is connected to the hull 202 that receives the pin 201. For example, the pin 201 may be pressed into, sintered with or soldered onto the hull 202. In another example, the interface of the hull 202 and the voltage-or-current-or-both controlling device 203 are sintered with each other, which allows to solder the combination of the hull 202 and the voltage-or-current-or-both controlling device 203 in one step to the metal layer 102.

In this embodiment no mold is required, since the hull 202 is soldered or sintered to the voltage-or-current-or-both controlling device 203. The combination of the voltage-or-current-or-both controlling device 203 and the hull 202 may then be mounted onto the substrate 101, e.g., with a hull soldering process commonly used for power modules. Then the pin 201 is pressed into the hull 202. Alternatively, the voltage-or-current-or-both controlling device 203 is sintered or soldered onto the pin 201 in a first step and soldered or sintered onto the metal layer 102 in a second step. These interfaces enable the respective electrical connections.

Figures 3, 4:
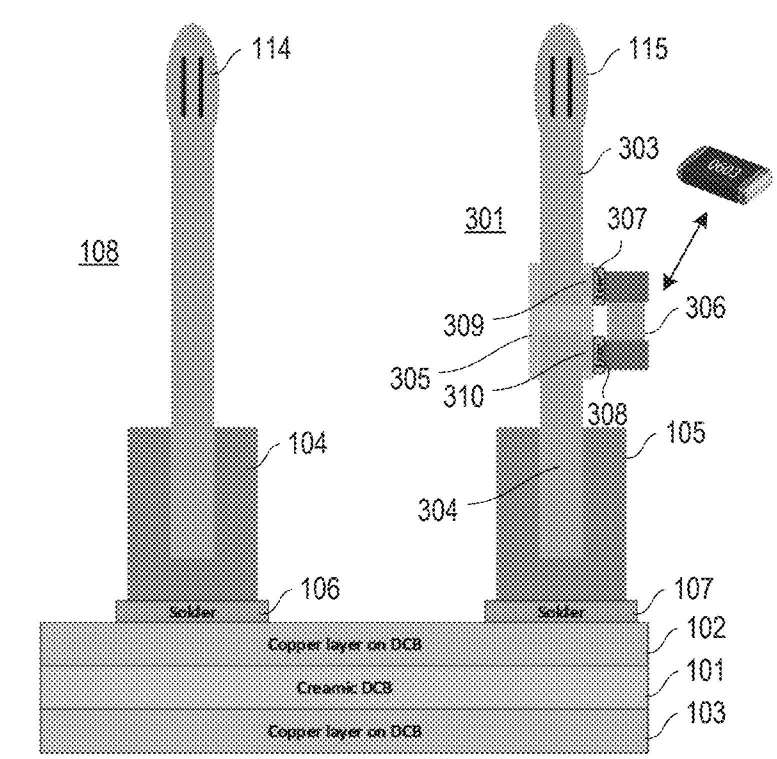
FIG. 3 is a cross-sectional view illustrating an exemplary embodiment of a power semiconductor module having a two-piece connection pin, into which a voltage-or-current-or-both controlling device that bypasses a mold compound, which adheres the two pieces of the connection pin to each other.
FIG. 4 is a cross-sectional view illustrating the embodiment shown in FIG. 4 with an additional voltage-or-current-or-both controlling device that bypasses the mold compound.

Referring now to FIG. 3, which illustrates another modification of the embodiment shown in and described above in connection with FIG. 1, the two-piece pin 109 and the hull 107 shown in FIG. 1 are replaced by a two-piece pin 301 and a hull 302. The pin 301 includes two pieces 303 and 304 that are mechanically connected via a mold compound 305 to provide stability between the two pieces 303 and 304 and to electrically insulate them from each other. A voltage-or-current-or-both controlling device 306, which here is a high voltage diode or any other electrical device as outlined above, is soldered on soldering pads 309 and 310 of the two pieces 303 and 304 of the pin 301. The soldering pads 309 and 310 may, for example, cut through the mold compound 305 perpendicularly to a longitudinal axis of the pin 301 in order to provide support for soldering layers 307 and 308 of each of the two pieces 303 and 304. The soldering layers 307 and 308 electrically connect the voltage-or-current-or-both controlling device 306 to the two pieces 303 and 304 of the pin 301. In the example shown, the voltage-or-current-or-both controlling device is soldered to the two-piece connection pin, but any other joining method may be employed to enable an electrical connection between the two pieces.

The two pieces 303 and 304 of the pin 301 are mechanically fixed to each other through adhesion provided by the mold compound 305. The soldering process for adhering and electrically connecting the high voltage diode 306 to the pieces 303 and 304 does not corrupt the mechanical stability of the joint between the two pieces 303 and 304 of the pin 301. Moreover the joint between the two pieces 303 and 304 may finally be enforced mechanically by the voltage-or-current-or-both controlling device 306.

FIG. 4 illustrates an expansion of the embodiment shown in and described above in connection with FIG. 3, in which an additional the voltage-or-current-or-both controlling device 401 is connected between the two pieces 303 and 304 of the pin 301, which means in parallel with the voltage diode 306. The additional voltage-or-current-or-both controlling device 401 is soldered to additional soldering pads 402 and 403 of the two pieces 303 and 304 of the pin 301. The additional soldering pads 402 and 403 may, for example, cut through the mold compound 305 perpendicularly to a longitudinal axis of the pin 301 and opposite to soldering pads 309 and 310 in order to provide support for soldering layers 404 and 405 at each of the two pieces 303 and 304. The additional solder layers 404 and 405 electrically connect the additional electrical device 401 to the two pieces 303 and 304 of the pin 301. In the example shown, the voltage-or-current-or-both controlling device is soldered to the two-piece connection pin, but any other joining method may be employed to enable an electrical connection between the two pieces.

This configuration may help to reduce the dissipated energy in the voltage-or-current-or-both controlling device 306 by splitting the power to a multiplicity of devices and may allow creating a more complex circuitry, such as a resistor-capacitor (RC) element. The mechanical stability of the joint between the two pieces 303 and 304 may be further enforced by the additional electrical device 401.

Figure 5:
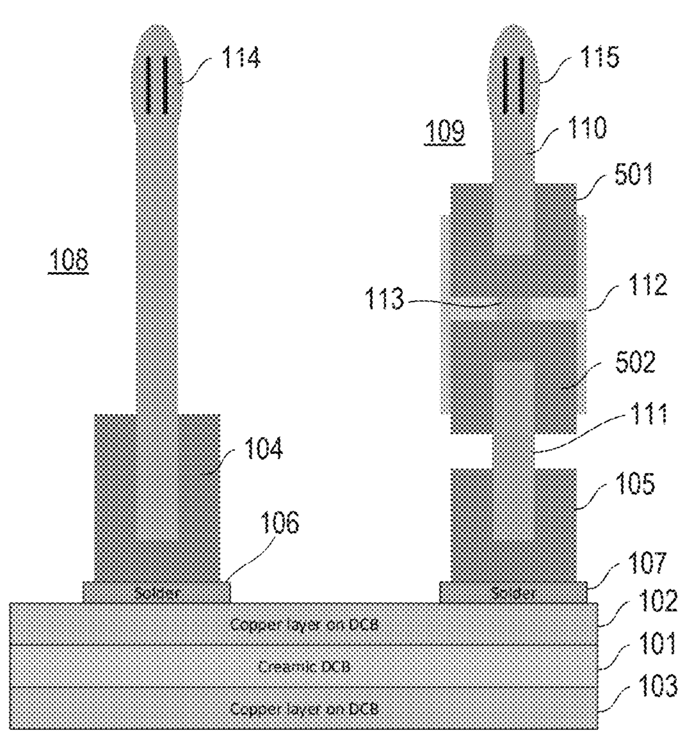
FIG. 5 is a cross-sectional view illustrating an exemplary embodiment of a power semiconductor module having a two-piece connection pin, into which a voltage-or-current-or-both controlling device is integrated by disposing the voltage-or-current-or-both controlling device between two additional hulls in order to receive the two pieces of the pin and by embedding the voltage-or-current-or-both controlling device and parts of the hulls in a compound mold.

In the embodiment shown in FIG. 5, which illustrates another modification of the embodiment shown in and described above in connection with FIG. 1, two additional hulls 501 and 502 are partly (shown in FIG. 5) or completely (not shown) embedded in the mold 112 and are electrically connected to the voltage-or-current-or-both controlling device 113 by pressing, soldering, sintering or in any other appropriate way. The two pieces 110 and 111 of the pin 109 are each pressed at one of their ends into one of the hulls 501 and 502.

Figure 6:
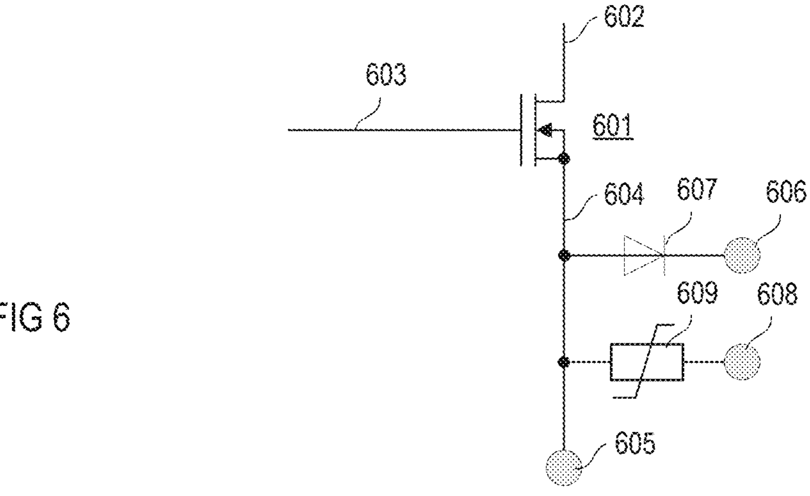
FIG. 6 is a circuit diagram illustrating a part of an exemplary circuit implemented in a power semiconductor module.

FIG. 6 shows a part of an exemplary circuit implemented in a power semiconductor module that uses at least one of the pins with an integrated voltage-or-current-or-both controlling device as described above. A semiconductor switch 601, which has a drain line 602, gate line 603 and source line 604, may be attached to a substrate (not shown) in a module housing (not shown). While the drain line 602 and the gate line 603 are connected to other devices (not shown) within the module, the source line 604 is connected to external circuitry by way of a pin 605 that is directly connected to the source line 604, a pin 606 that is connected to the source line 604 via a diode 607 and a pin 608 that is connected to the source line 604 via an NTC resistor 609. For example, pin 605 may be implemented similar or identical to pin 108 described above in connection with FIG. 1, pin 606 may be implemented similar or identical to pin 109 described above in connection with FIG. 1 or to pin 301 described above in connection with FIG. 3 or to pin 501 described above in connection with FIG. 5, and pin 608 may be implemented similar or identical to pin 201 described above in connection with FIG. 2.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power semiconductor module, comprising:

an electrically insulating carrier plate with a structured, electrically conducting metallization layer disposed on a surface of the electrically insulating carrier plate;

a connection pin having two ends and being adhered to the electrically insulating carrier plate, one end of the connection pin being electrically connected to the metallization layer;

a semiconductor device adhered to the electrically insulating carrier plate and electrically connected to the metallization layer; and a discrete circuit comprising a voltage-or-current-or-both controlling device, the voltage-or-current-or-both controlling device being operatively coupled with the semiconductor device and integrated in the connection pin at one of or between the two ends of the connection pin.

2. The power semiconductor module of claim 1, wherein the voltage-or-current-or-both controlling device is a diode, a capacitor, a thermistor, or a resistor.

3. The power semiconductor module of claim 1, wherein at least one end of the connection pin comprises an area adapted for a press fit connection or for a solder connection.

4. The power semiconductor module of claim 1, wherein the connection pin has two separate pieces that are electrically connected to each other via the voltage-or-current-or-both controlling device, and wherein the voltage-or-current-or-both controlling device is disposed between the two pieces of the connection pin and embedded in a first mold compound that mechanically connects the two pieces of the connection pin.

5. The power semiconductor module of claim 4, wherein a first one of the two pieces includes the one end of the connection pin, is adhered to the electrically insulating carrier plate, and is electrically connected to the metallization layer, and wherein a second one of the two pieces includes the other end of the connection pin and serves as an external connection element.

6. The power semiconductor module of claim 5, wherein the first piece is adhered to the electrically insulating carrier plate and electrically connected to the metallization layer via a first socket that is, on one side, soldered to the metallization layer and, on the other side, electrically and mechanically connected to the first piece.

7. The power semiconductor module of claim 6, wherein the first socket is or comprises a hull, the hull having a cup-like shape with a cavity configured to receive the first piece of the connection pin.

8. The power semiconductor module claim 1, wherein the connection pin has two separate pieces that are mechanically connected to each other via a mold compound and electrically via the voltage-or-current-or-both controlling device, and wherein the voltage-or-current-or-both controlling device is disposed outside the mold compound and is electrically connected between contact pads of the two pieces of the connection pin to electrically bypass the mold compound.

9. The power semiconductor module of claim 8, wherein the discrete circuit further comprises an additional voltage-or-current-or-both controlling device that is disposed outside the mold compound and is electrically connected between additional contact pads of the two pieces of the connection pin to electrically bypass the mold compound.

10. The power semiconductor module of claim 9, wherein the additional voltage-or-current-or-both controlling device is a diode, a capacitor, a thermistor, or a resistor.

11. The power semiconductor module of claim 1, wherein the connection pin has two separate pieces that are mechanically connected to each other via two hulls that are at least partly embedded in a mold compound and that are electrically connected to each other via the two hulls and the voltage-or-current-or-both controlling device, and wherein the voltage-or-current-or-both controlling device is disposed between the two hulls.

12. The power semiconductor module of claim 1, wherein the connection pin has a first piece and a second piece separate from the first piece, and wherein the second piece comprises an area adapted for a press fit connection or for a solder connection to serve as an external connection element.

13. The power semiconductor module of claim 1, wherein the connection pin is one piece and is adhered to the electrically insulating carrier plate and electrically connected to the metallization layer via a socket and the voltage-or-current-or-both controlling device, and wherein the voltage-or-current-or-both controlling device is, on one side, soldered to the metallization layer and, on another side, connected to the socket which is mechanically and electrically connected to the connection pin.

14. The power semiconductor module of claim 13, wherein the socket is or comprises a hull, the hull having a cup-like shape with a cavity configured to receive the connection pin.

* * * * *